United States Patent
Kudo

(10) Patent No.: US 9,006,017 B2
(45) Date of Patent: Apr. 14, 2015

(54) PHOTOELECTRIC CONVERSION DEVICE AND METHOD FOR MANUFACTURING THE SAME

(71) Applicant: Seiko Epson Corporation, Tokyo (JP)

(72) Inventor: Manabu Kudo, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 14/492,619

(22) Filed: Sep. 22, 2014

(65) Prior Publication Data

US 2015/0011041 A1    Jan. 8, 2015

Related U.S. Application Data

(62) Division of application No. 13/422,406, filed on Mar. 16, 2012, now Pat. No. 8,883,537.

(30) Foreign Application Priority Data

Mar. 23, 2011 (JP) ................................. 2011-063894

(51) Int. Cl.
*H01L 21/00* (2006.01)
*H01L 31/18* (2006.01)
*H01L 31/032* (2006.01)

(52) U.S. Cl.
CPC ............ *H01L 31/18* (2013.01); *H01L 31/0322* (2013.01)

(58) Field of Classification Search
None
See application file for complete search history.

(56) References Cited

U.S. PATENT DOCUMENTS

| | | | |
|---|---|---|---|
| 7,217,983 | B2 | 5/2007 | Suzuki |
| 8,415,557 | B2 | 4/2013 | Fukunaga et al. |
| 2010/0236606 | A1 | 9/2010 | Kobayashi et al. |
| 2010/0243049 | A1 | 9/2010 | Leidholm et al. |
| 2011/0024859 | A1 | 2/2011 | Miyazaki et al. |
| 2011/0253208 | A1 | 10/2011 | Ohmi |
| 2012/0017993 | A1 | 1/2012 | Yuuya |
| 2012/0031492 | A1 | 2/2012 | Sevvana et al. |
| 2012/0037407 | A1 | 2/2012 | Ohmi et al. |

(Continued)

FOREIGN PATENT DOCUMENTS

| | | |
|---|---|---|
| JP | A-2003-318424 | 11/2003 |
| JP | A-2005-86167 | 3/2005 |
| JP | A-2009-259872 | 11/2009 |

(Continued)

OTHER PUBLICATIONS

Jul. 17, 2014 Notice of Allowance issued in U.S. Appl. No. 13/422,406.

(Continued)

*Primary Examiner* — Charles Garber
*Assistant Examiner* — Evren Seven
(74) *Attorney, Agent, or Firm* — Oliff PLC

(57) ABSTRACT

A circuit layer is formed on a surface of a substrate and includes a transistor. A photoelectric conversion element includes a photoelectric conversion layer of a chalcopyrite-type semiconductor provided between a first electrode and a second electrode. A supply layer is formed between the circuit layer and the photoelectric conversion layer and contains an Ia group element. Diffusion of the Ia group element to the photoelectric conversion layer improves the photoelectric conversion efficiency. A protective layer is formed between the supply layer and the circuit layer and prevents the diffusion of the Ia group element to the circuit layer.

4 Claims, 4 Drawing Sheets

(56) References Cited

U.S. PATENT DOCUMENTS

2012/0305049 A1  12/2012  Yuya et al.
2012/0306040 A1  12/2012  Yuya

FOREIGN PATENT DOCUMENTS

JP          2010-232567 A      10/2010
JP          2010-239129 A      10/2010

OTHER PUBLICATIONS

Apr. 25, 2014 *Ex Parte Quayle* Action issued in U.S. Appl. No. 13/422,406.
Nov. 7, 2013 Final Rejection issued in U.S. Appl. No. 13/422,406.
Aug. 22, 2013 Non-Final Rejection issued in U.S. Appl. No. 13/422,406.
Jun. 4, 2013 Restriction Requirement issued in U.S. Appl. No. 13/422,406.

STEP P1

STEP P2

STEP P3

STEP P4A

STEP P5

STEP P4B

PHOTOELECTRIC CONVERSION DEVICE AND METHOD FOR MANUFACTURING THE SAME

CROSS-REFERENCE TO THE RELATED APPLICATIONS

This application is a divisional application of U.S. patent application Ser. No. 13/422,406, filed Mar. 16, 2012, which claims priority to Japanese Patent Application No. 2011-063894, filed Mar. 23, 2011, the entire contents of which are incorporated herein by reference.

BACKGROUND

1. Technical Field

The present invention relates to a photoelectric conversion technique using a chalcopyrite-type semiconductor.

2. Related Art

Heretofore, photoelectric conversion techniques using a chalcopyrite-type semiconductor have been proposed. For example, JP-A-2009-259872 has disclosed an imaging device in which a circuit layer including a thin film transistor and a photoelectric conversion layer of a chalcopyrite-type semiconductor are formed on a substrate. In addition, in consideration of the fact in which photoelectric conversion efficiency of a chalcopyrite-type semiconductor is improved by diffusion of an Ia group element, JP-A-2005-086167 has proposed the structure in which a compound layer containing an Ia group element is laminated on a photoelectric conversion layer (light absorbing layer). The compound layer is formed, for example, of an alkali compound, such as $Na_3AlF_6$.

SUMMARY

When the compound layer disclosed in JP-A-2005-086167 is provided between the circuit layer and the photoelectric conversion layer in order to improve the photoelectric conversion efficiency of the imaging device disclosed in JP-A-2009-259872, the Ia group element contained in the compound layer diffuses into the circuit layer and functions as movable ions in a semiconductor layer of the thin film transistor. Therefore, degradation and errors in characteristics of the thin film transistor may disadvantageously occur (that is, the reliability is degraded). An advantage of some aspects of the invention is to improve the photoelectric conversion efficiency while the diffusion of the Ia group element to the circuit layer is prevented.

A photoelectric conversion device according to an aspect of the invention comprises: a circuit layer including a semiconductor element; a photoelectric conversion layer including a chalcopyrite-type semiconductor; a supply layer which is provided between the circuit layer and the photoelectric conversion layer and which contains an Ia group element; and a protective layer which is provided between the supply layer and the circuit layer to prevent diffusion of the Ia group element to the circuit layer. According to the above structure, when the Ia group element contained in the supply layer diffuses to the photoelectric conversion layer, the photoelectric conversion efficiency is improved. In addition, since the protective layer is provided between the supply layer and the circuit layer, the diffusion of the Ia group element from the supply layer to the circuit layer can be prevented. As the Ia group element, sodium (Na), potassium (K), and lithium (Li) are preferably used.

In a preferable aspect of the invention, the supply layer includes a silicon oxide ($SiO_x$), the protective layer includes a silicon nitride ($SiN_x$), and the supply layer and the protective layer are in contact with each other. Since a silicon oxide and a silicon nitride have high adhesion to each other, in the above structure, the supply layer can be advantageously prevented from being peeled away from the protective layer.

A method for manufacturing a photoelectric conversion device according to another aspect of the invention comprises: a step (such as a step P1) of forming a circuit layer including a semiconductor element on a substrate; a step (such as a step P2) of forming a protective layer on the circuit layer to prevent diffusion of an Ia group element thereto; a step (such as a step P3 and a step P4A or a step P4B) of forming a supply layer containing the Ia group element on the protective layer; and a step (such as a step P5) of forming a photoelectric conversion layer of a chalcopyrite-type semiconductor on the supply layer. According to the above method, an effect similar to that of the photoelectric conversion device according to above aspect of the invention can be realized.

In a preferable example of the manufacturing method according to the above aspect of the invention, in the step of forming a protective layer, the protective layer is formed from a silicon nitride ($SiN_x$), and in the step of forming a supply layer, the supply layer is formed from a silicon oxide ($SiO_x$). In the above aspect of the invention, the supply layer can be advantageously prevented from being peeled away.

In a first example of the manufacturing method according to the above aspect of the invention, the step of forming a supply layer includes a substep (such as the step P3) of forming a base layer on the protective layer and a substep (such as the step P4A) of diffusing the Ia group element to the base layer by a plasma treatment which uses an inert gas supplied through a shower plate to which the Ia group element is adhered. In a second example of the manufacturing method according to the above aspect of the invention, the step of forming a supply layer includes a substep (such as the step P3) of forming a base layer on the protective layer, and a substep (such as the step P4B) of diffusing the Ia group element to the base layer by a plasma treatment which uses a mixed gas containing the Ia group element and an inert gas. In both the first example and the second example, the Ia group element can be reliably diffused to the base layer by a plasma treatment. In addition, according to the manufacturing method of the second example, the diffuse density of the Ia group element to the base layer can be advantageously easily and accurately controlled.

BRIEF DESCRIPTION OF THE DRAWINGS

The invention will be described with reference to the accompanying drawings, wherein like numbers reference like elements.

DESCRIPTION OF EXEMPLARY EMBODIMENTS

A: First Embodiment

Structure of Photoelectric Conversion Device 100

Figure 1:
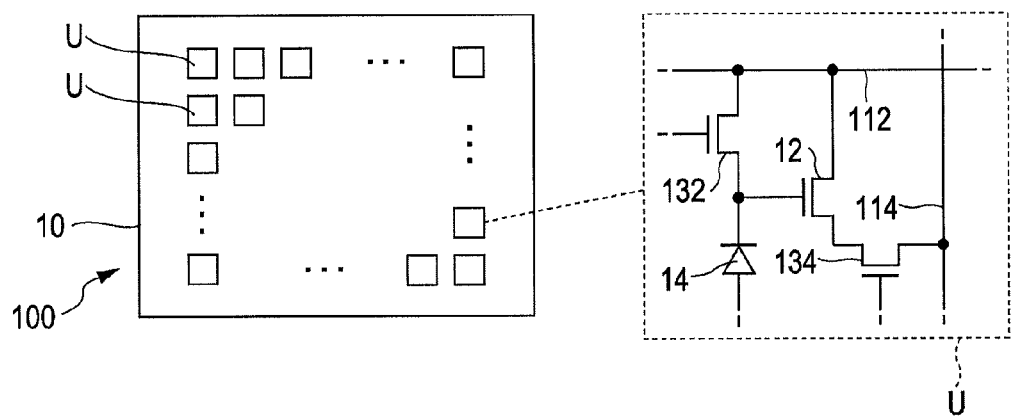
FIG. 1 is a plan view of a photoelectric conversion device according to a first embodiment of the invention.

FIG. 1 is a schematic view of a photoelectric conversion device 100 according to a first embodiment of the invention. The photoelectric conversion device 100 is an imaging device (intravenous sensor) which takes an intravenous image of a living body, for example, for attestation processing, and as shown in FIG. 1, this photoelectric conversion device 100 includes a substrate 10 and a plurality of unit elements U. The substrate 10 is a plate-shaped member, such as a glass substrate. The unit elements U are arranged in a matrix on one surface of the substrate 10.

As typically shown in FIG. 1, one unit element U is disposed at a position corresponding to the intersection between a constant potential line 112 and a detection line 114 and includes a transistor 12, a transistor 132, a transistor 134, and a photoelectric conversion element 14. The photoelectric conversion element 14 generates a charge corresponding to the amount of light received. The transistor 12 and the transistor 134 are connected in series between the constant potential line 112 and the detection line 114. A gate electrode of the transistor 12 is connected to the photoelectric conversion element 14, and the transistor 132 is connected between the gate electrode of the transistor 12 and the constant potential line 112.

When the transistor 132 is controlled in an ON state, the electrical potential of the gate electrode of the transistor 12 is initialized to the electrical potential of the constant potential line 112 and is then changed to an electrical potential corresponding to the amount of light received of the photoelectric conversion element 14. Hence, when the transistor 134 is controlled in an On state, a detection signal of a current value corresponding to the amount of light received (electrical potential of the gate electrode of the transistor 12) of the photoelectric conversion element 14 is output to the detection line 114 from the constant potential line 112 through the transistor 12 and the transistor 134. That is, the individual transistors (12, 132 and 134) in the unit circuit U are semiconductor elements used for control (drive of the photoelectric conversion element 14) of input/output of the detection signal. In addition, the concrete structure of the unit element U is optionally formed.

Figure 2:
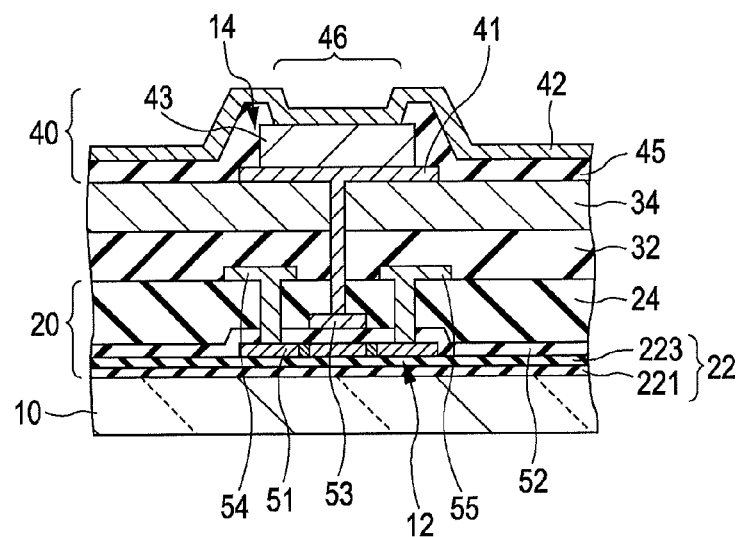
FIG. 2 is a cross-sectional view of the photoelectric conversion device.

FIG. 2 is a cross-sectional view of a portion of the photoelectric conversion device 100 corresponding to one unit element U. As shown in FIG. 2, the photoelectric conversion device 100 has the structure in which a circuit layer 20, a protective layer 32, a supply layer 34, and a light-receiving layer 40 are laminated in this order on the surface of the substrate 10. The supply layer 34 is provided between the circuit layer 20 and the light-receiving layer 40, and the protective layer 32 is provided between the circuit layer 20 and the supply layer 34.

The circuit layer 20 includes an underlayer 22, the transistor 12 of FIG. 1, and an interlayer insulating film 24. The underlayer 22 is a thin film functioning as a ground which forms the transistor 12 and is a laminate of a first layer 221 formed, for example, of a silicon nitride ($SiN_x$) on the surface of the substrate 10 and a second layer 223 formed, for example, of a silicon oxide ($SiO_x$) on the surface of the first layer 221. In addition, the underlayer 22 may also be omitted.

The transistor 12 is a thin film transistor including a semiconductor layer 51, a gate insulating film 52, a gate electrode 53, a first electrode 54 (one of a source electrode and a drain electrode), and a second electrode 55 (the other one of the source electrode and the drain electrode). The semiconductor layer 51 is formed of a semiconductor material, such as polysilicon, to have an island shape on the surface of the underlayer 22. The gate electrode 53 faces a channel region of the semiconductor layer 51 with the gate insulating film 52 provided therebetween. The interlayer insulating film 24 is formed over the whole substrate 10 so as to cover the semiconductor layer 51 and the gate electrode 53. The first electrode 54 and the second electrode 55 are each formed on the surface of the interlayer insulating film 24 and electrically connected to the semiconductor layer 51 through a conduction hole which penetrates the interlayer insulating film 24 and the gate insulating film 52.

The protective layer 32 of FIG. 2 is formed over the whole substrate 10 so as to cover the circuit layer 20 (interlayer insulating film 24), and the supply layer 34 is formed over the whole substrate 10 so as to cover the protective layer 32. The protective layer 32 and the supply layer 34 are sequentially formed in successive steps so as to be in contact with each other.

The supply layer 34 is a layer which supplies an Ia group element (alkali metal) to the photoelectric conversion element 14. The supply layer 34 is formed by diffusing an Ia group element to a thin film of a silicon oxide ($SiO_2$). As the Ia group element (that is, a substance which increases the conversion efficiency of the photoelectric conversion element 14) in the supply layer 34, sodium (Na), potassium (K), and lithium (Li) are preferable.

The protective layer (passivation layer) 32 provided between the circuit layer 20 and the supply layer 34 prevents the diffusion of the Ia group element to the circuit layer 20 (transistor 12) from the supply layer 34. For example, a silicon nitride ($Si_3N_4$) having a function to prevent the diffusion of the Ia group element is preferable as a material of the protective layer 32.

The light-receiving layer 40 of FIG. 2 includes the photoelectric conversion element 14 of FIG. 1. The photoelectric conversion element 14 is a light receiving element in which a photoelectric conversion layer 43 is provided between a first electrode 41 and a second electrode 42. The first electrode 41 is formed, for example, of an electrical conductive material, such as molybdenum (Mo), having a low resistance and is electrically connected to the gate electrode 53 of the transistor 12 through a conduction hole which penetrates the supply layer 34, the protective layer 32, and the interlayer insulating film 24.

The photoelectric conversion layer 43 is a light absorbing layer formed from a chalcopyrite-type semiconductor and generates a charge corresponding to the amount of light received. As the chalcopyrite-type semiconductor, for example, $CuInSe_2$ (CIS) and $Cu(In, Ga)Se_2$ (CIGS) are preferable. The surface of the supply layer 34 on which the first electrode 41 and the photoelectric conversion layer 43 are formed is covered with an insulating layer 45. The second electrode 42 is formed of a light transmittance electrical conductive material, such as indium tin oxide (ITO) or indium zinc oxide (IZO), and is continuously formed over the unit elements U. The second electrode 42 is in contact with the photoelectric conversion layer 43 through an opening 46 formed in the insulating layer 45.

In the structure described above, when the Ia group element contained in the supply layer 34 diffuses to the photoelectric conversion layer 43 during the formation of the light-receiving layer 40, the photoelectric conversion efficiency is improved. On the other hand, since the protective layer 32 is provided between the supply layer 34 and the circuit layer 20, the diffusion of the Ia group element to the circuit layer 20 from the supply layer 34 is prevented by the protective layer 32. Therefore, degradation and errors in characteristics of the transistor 12 resulting from the diffusion of the Ia group element to the semiconductor layer 51 can be effectively prevented. That is, according to the first embodiment, the prevention of the diffusion of the Ia group element to the circuit layer 20 and the improvement in photoelectric conversion efficiency of the photoelectric conversion element 14 can be advantageously obtained at the same time.

Method for Manufacturing Photoelectric Conversion Device 100

FIGS. 3A to 3E are cross-sectional views each showing a step of manufacturing the photoelectric conversion device 100 described above. In a first step P1 shown in FIG. 3A, the circuit layer 20 including the transistor 12 is formed on the surface of the substrate 10. A known technique is optionally used for the formation of the circuit layer 20.

Figure 3A:
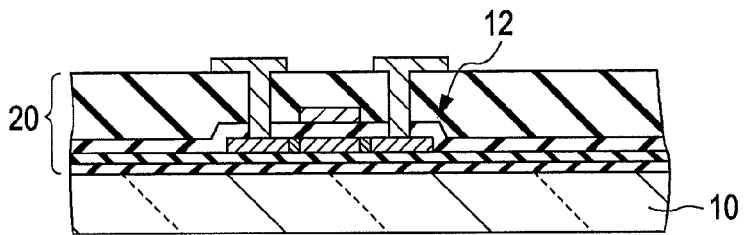
FIGS. 3A to 3E are cross-sectional views each showing a step of manufacturing the photoelectric conversion device.
Figure 3B:
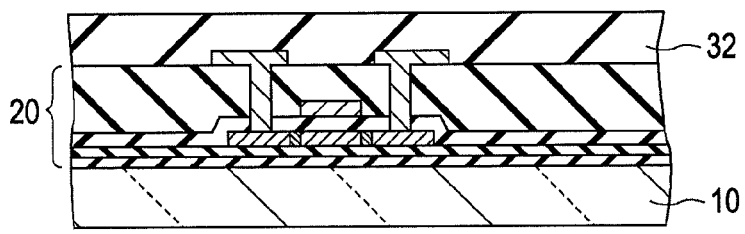

In a step P2 shown in FIG. 3B following the step P1, the protective layer 32 covering the circuit layer 20 is formed using a silicon nitride ($Si_3N_4$). Although a known film formation technique (such as sputtering or vacuum deposition) may be optionally used for the formation of the protective layer 32, in particular, plasma chemical vapor deposition (CVD) is preferable. The protective layer 32 is formed to have a thickness, for example, of approximately 30 to 1,000 nm so as to effectively prevent the diffusion of the Ia group element to the circuit layer 20.

Figure 3C:
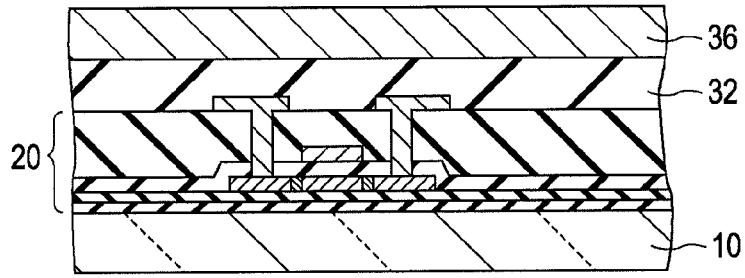
Figure 3D:
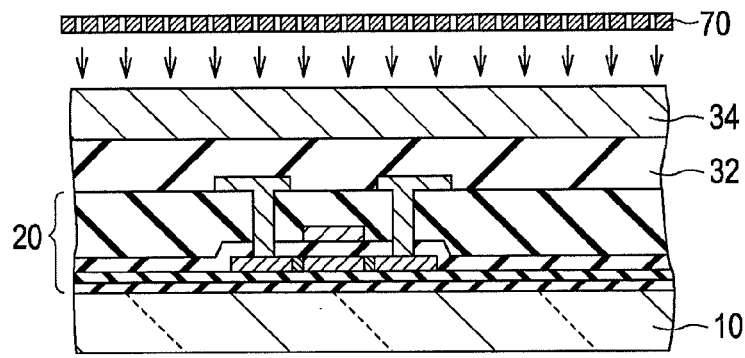

In a step P3 shown in FIG. 3C and a step P4A shown in FIG. 3D, which sequentially follow the step P2, the supply layer 34 is formed. In the step P3, the base layer 36 covering the protective layer 32 is formed using a silicon oxide ($SiO_2$). The base layer 36 (supply layer 34) is formed to have a thickness, for example, of approximately 200 to 2,000 nm. Although a known film formation technique (such as sputtering or vacuum deposition) may be optionally used for the formation of the base layer 36, as in the case of the protective layer 32, in particular, plasma CVD is preferable. The protective layer 32 and the base layer 36 can be successively formed without taking out the substrate 10 from a process room (chamber).

In the step P4A following the step P3, the supply layer 34 is formed by diffusing the Ia group element to the base layer 36 formed in the step P3. A plasma treatment is suitably performed for the diffusion of the Ia group element to the base layer 36. In particular, as shown in FIG. 3D, when a plasma treatment which generates plasma is performed while an inert gas (such as hydrogen, helium, or argon) is sprayed to the substrate 10 through a shower plate 70 to which the Ia group element is adhered, the Ia group element is introduced into the base layer 36.

Figure 3E:
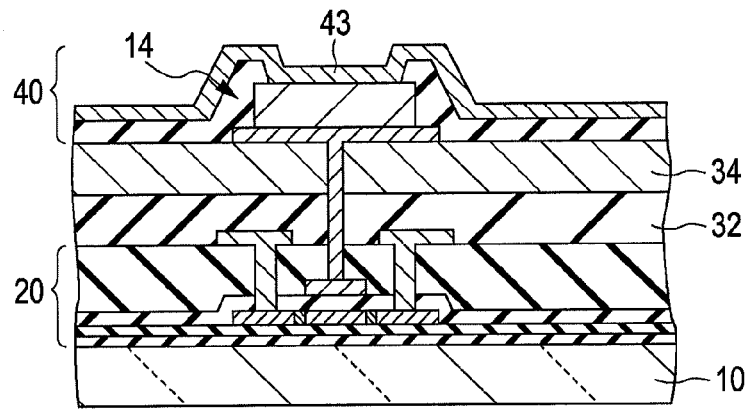

In a step P5 shown in FIG. 3E following the step P4A, the light-receiving layer 40 is formed on the surface of the supply layer 34 formed in the step P4A. Known techniques (film formation technique and patterning technique) are optionally used for the formation of the light-receiving layer 40. As described above, the photoelectric conversion layer 43 is formed using a chalcopyrite-type semiconductor (CIS or CIGS). When the photoelectric conversion layer 43 is formed, the Ia group element in the supply layer 34 diffuses into the photoelectric conversion layer 43. On the other hand, the diffusion of the Ia group element to the circuit layer 20 is prevented by the protective layer 32.

Figure 4A:
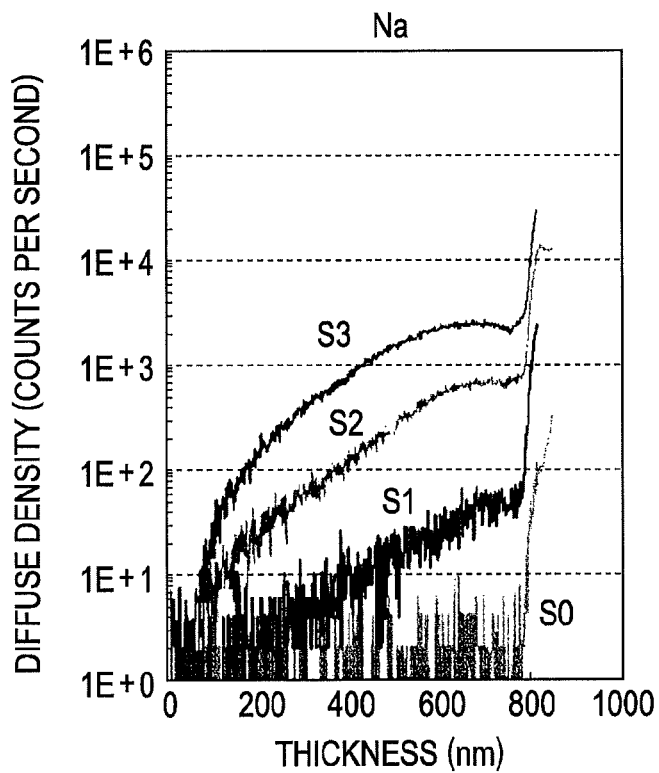
FIGS. 4A and 4B are graphs each showing the relationship between the thickness of a supply layer and the diffuse density of an Ia group element.
Figure 4B:
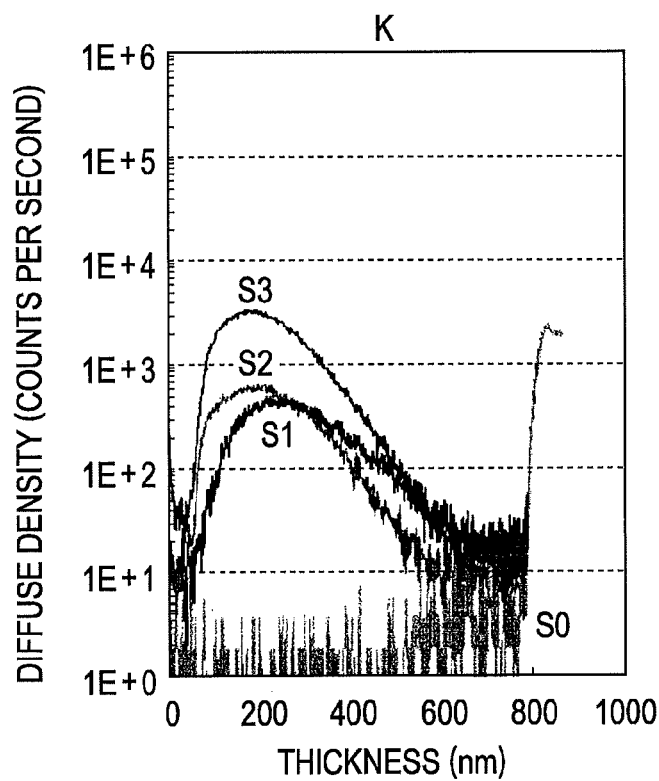

FIGS. 4A and 4B are graphs each showing the relationship between the thickness of the base layer 36 (supply layer 34) and the concentration (hereinafter, referred to as "diffuse density") of the Ia group element to be diffused to the base layer 36 in the step P4A, and for this measurement, an amount S of the Ia group element adhered to the shower plate 70 in the step P4A was changed several times (S0 to S3) so as to satisfy S0<S1<S2<S3. As an index of the diffuse density, a count value (counts per second) of the Ia group element per second is shown on the vertical axis of each of FIGS. 4A and 4B. FIG. 4A indicates the case in which sodium (Na) is diffused to the base layer 36, and FIG. 4B indicates the case in which potassium (K) is diffused to the base layer 36. From FIGS. 4A and 4B, it is understood that as the amount S of the Ia group element adhered to the shower plate 70 is increased, the diffuse density of the Ia group element to the base layer 36 tends to increase.

As apparent from FIG. 4A, when sodium (Na), one of Ia group elements, is diffused to the base layer 36, the diffuse density is increased as the thickness of the base layer 36 is increased. Accordingly, in order to sufficiently improve the photoelectric conversion efficiency of the photoelectric conversion element 14 by increasing the diffuse density, the base layer 36 is preferably formed to have a sufficiently large thickness. However, if the thickness of the base layer 36 is excessively increased, the substrate 10 may be deformed by a film stress of the base layer 36. In addition, if the diffuse density is excessively increased, unless the thickness of the protective layer 32 is considerably increased, the diffusion of the Ia group element to the circuit layer 20 may not be completely prevented.

In consideration of the above situation, under the condition in which the protective layer 32 is formed to have a thickness of approximately 30 to 1,000 nm as described above, it is preferable that the base layer 36 (supply layer 34) be formed to have a thickness of approximately 200 to 2,000 nm, and that the amount S of the Ia group element adhered to the shower plate 70 be controlled so that the diffuse density is $1\times10^{10}$ to $1\times10^{16}\,cm^{-2}$ (more preferably $1\times10^{12}\,cm^{-2}$). In the case of potassium shown in FIG. 4B, the thickness of the protective layer 32, the thickness of the base layer 36 (supply layer 34), and the diffuse density of the Ia group element are selected as in the case described above.

By the way, in order to diffuse the Ia group element to the photoelectric conversion layer 43, the supply layer 34 may be formed using an alkali compound, such as $Na_3AlF_6$ disclosed in JP-A-2005-086167. However, since characteristics, such as a film stress, of a silicon nitride forming the protective layer 32 is significantly different from those of an alkali compound, the supply layer 34 (base layer 36) may be peeled away from the protective layer 32 in some cases. On the other hand, in the first embodiment, since the supply layer 34 is formed of a silicon oxide having high adhesion (affinity) to the protective layer 32 formed of a silicon nitride, the supply layer 34 can be effectively prevented from being peeled away. In addition, an alkali compound having deliquescence is difficult to handle, and on the other hand, a silicon oxide is a stable material and can be easily formed. Hence, according to the first embodiment in which the supply layer 34 is formed from a silicon oxide, a process for manufacturing the photoelectric conversion device 100 can be advantageously simplified.

B: Second Embodiment

Figure 5:
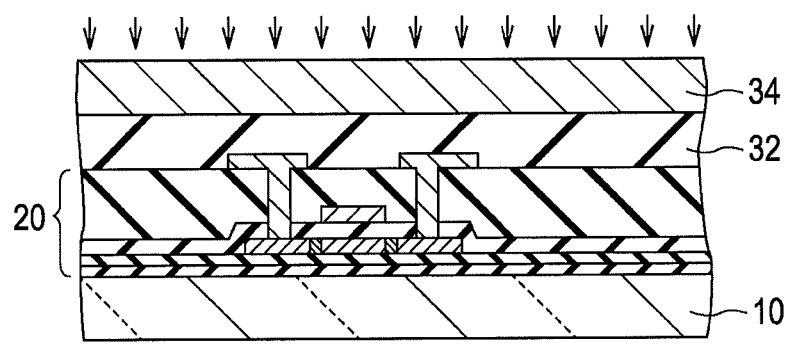
FIG. 5 is a cross-sectional view illustrating a step of forming a supply layer of a second embodiment.

A second embodiment of the invention will be described. In the second embodiment, instead of using the step P4A of the first embodiment, a step P4B shown in FIG. 5 is performed. As shown in FIG. 5, in the step P4B, the Ia group element is diffused to the base layer 36 formed in the step P3 by a plasma treatment which generates plasma while a mixed gas of an inert carrier gas (such as hydrogen, helium, or argon)

and the Ia group element is sprayed to the substrate 10. The concentration of the Ia group element in the mixed gas is selected so that the diffuse density of the Ia group element to the supply layer 34 is approximately $1\times10^{10}$ to $1\times10^{16}$ cm$^{-2}$ (preferably $1\times10^{12}$ cm$^{-2}$) as in the case of the first embodiment.

An effect similar to that of the first embodiment can also be realized in the second embodiment. In addition, in the second embodiment, since the mixed gas containing the Ia group element is used for the plasma treatment, compared to the case of the first embodiment in which the Ia group element is adhered to the shower plate 70, the diffuse density of the Ia group element can be advantageously easily and accurately controlled.

C: Modifications

The individual embodiments described above by way of example may be variously modified. Aspects of concrete modifications will be described by way of example. At least two aspects optionally selected from the following examples may be appropriately used in combination.

1. Modification 1

The material of the protective layer 32 is not limited to a silicon nitride (SiN$_x$). That is, an optional material which can prevent the diffusion of the Ia group element may be used to form the protective layer 32. As is the case described above, a material of the supply layer 34 is not limited to a silicon oxide (SiO$_x$). For example, the supply layer 34 can be formed using an alkali compound, such as Na$_3$AlF$_6$ disclosed in JP-A-2005-086167. However, a silicon oxide is preferable as the material of the supply layer 34 in view of the handling easiness in a manufacturing process described above. In addition, when the protective layer 32 is formed using a silicon nitride, a silicon oxide is particularly preferable as the material of the supply layer 34 also in view of the adhesion to the protective layer 32 described above.

2. Modification 2

Between the individual layers (the circuit layer 20, the protective layer 32, the supply layer 34, and the light-receiving layer 40) of the photoelectric conversion device 100, other layers are appropriately inserted. For example, another layer may be provided between the protective layer 32 and the supply layer 34. However, in the structure in which the protective layer 32 is formed from a silicon nitride and the supply layer 34 is formed from a silicon oxide, in view of the adhesion between the protective layer 32 and the supply layer 34 described above, as described in each embodiment by way of example, the protective layer 32 and the supply layer 34 are preferably successively formed so as to be in contact with each other.

3. Modification 3

In the above embodiments, although the photoelectric conversion element 14 (the first electrode 41) is connected to the gate electrode 53 of the transistor 12, a connection destination of the photoelectric conversion element 14 may be appropriately changed. For example, the structure in which the photoelectric conversion element 14 is connected to the first electrode 54 or the second electrode 55 of the transistor 12 may also be used. However, the semiconductor element formed in the circuit layer 20 is not limited to the transistor 12. For example, the invention may also be applied to the structure in which a semiconductor element, such as a diode, is formed in the circuit layer 20. In addition, in the above embodiments, although the transistor 12 (thin film transistor) formed on the surface of the substrate 10 is described by way of example, in the structure in which a semiconductor substrate is used as the substrate 10, the transistor 12 can be directly formed in the substrate 10.

The entire disclosure of Japanese Patent Application No. 2011-063894, filed Mar. 23, 2011 is expressly incorporated by reference herein.

What is claimed is:

1. A method for manufacturing a photoelectric conversion device comprising:
    forming a circuit layer including a semiconductor element on a substrate;
    forming a protective layer on the circuit layer to prevent diffusion of an Ia group element to the circuit layer;
    forming a supply layer containing the Ia group element on the protective layer;
    forming a first electrode that contacts the circuit layer, the first electrode extending through the protective layer and the supply layer; and
    forming a photoelectric conversion layer of a chalcopyrite-type semiconductor on the supply layer, the first electrode contacting the photoelectric conversion layer and the circuit layer.

2. The method for manufacturing a photoelectric conversion device according to claim 1,
    wherein in the forming a protective layer, the protective layer is formed from a silicon nitride, and
    in the forming a supply layer, the supply layer is formed from a silicon oxide.

3. The method for manufacturing a photoelectric conversion device according to claim 1,
    wherein the forming a supply layer includes:
    forming a base layer on the protective layer; and
    diffusing the Ia group element to the base layer by a plasma treatment using an inert gas supplied through a shower plate to which the Ia group element is adhered.

4. The method for manufacturing a photoelectric conversion device according to claim 1,
    wherein the forming a supply layer includes:
    forming a base layer on the protective layer; and
    diffusing the Ia group element to the base layer by a plasma treatment using a mixed gas containing the Ia group element and an inert gas.

* * * * *